US012622214B2

(12) United States Patent
Shen et al.

(10) Patent No.: US 12,622,214 B2
(45) Date of Patent: May 5, 2026

(54) OBJECT CONVEYING SYSTEM

(71) Applicants: Taiwan Daifuku Co., Ltd., Tainan (TW); DAIFUKU CO., LTD., Osaka (JP)

(72) Inventors: Chiayang Shen, Tainan (TW); Yuching Lin, Tainan (TW); Kuanchih Lin, Tainan (TW)

(73) Assignees: Taiwan Daifuku Co., Ltd., Tainan (TW); DAIFUKU CO., LTD., Osaka (JP)

( * ) Notice: Subject to any disclaimer, the term of this patent is extended or adjusted under 35 U.S.C. 154(b) by 175 days.

(21) Appl. No.: 18/780,431

(22) Filed: Jul. 22, 2024

(65) Prior Publication Data

US 2025/0285898 A1      Sep. 11, 2025

(30) Foreign Application Priority Data

Mar. 11, 2024    (TW) ................................. 113108847

(51) Int. Cl.
H10P 72/00        (2026.01)
B66C 19/00        (2006.01)
H10P 72/30        (2026.01)

(52) U.S. Cl.
CPC .......... H10P 72/3202 (2026.01); B66C 19/00 (2013.01); H10P 72/3221 (2026.01)

(58) Field of Classification Search
CPC ...... B65H 15/30; B65H 35/06; B65H 49/061; B65H 2201/0297; H10P 72/3302
See application file for complete search history.

(56) References Cited

FOREIGN PATENT DOCUMENTS

| CN | 112930291 | A | * | 6/2021 | ....... | H01L 21/67715 |
|----|-----------|---|---|--------|---------|---------------|
| CN | 117067923 | A | * | 11/2023 | ....... | H01L 21/67715 |
| GB | 2264918 | A | * | 9/1993 | ........... | B65G 17/065 |

* cited by examiner

*Primary Examiner* — Emmanuel M Marcelo
(74) *Attorney, Agent, or Firm* — JCIPRNET

(57)        ABSTRACT

The disclosure discloses an object conveying system including an object conveying apparatus and a mounting table. The object conveying apparatus includes a traveling member, the vehicle member, and a transporting member. A rail which extends along a horizontal direction is disposed between the object conveying system and the mounting table. A horizontal moving mechanism of the vehicle member moves back and forth along the rail. A horizontal height of a lowest end of an outer peripheral edge of a first wheel on the horizontal moving mechanism is higher than a horizontal height of a lowest end of an outer peripheral edge of a second wheel. While the horizontal moving mechanism is moving to a direction away from the object conveying apparatus, the first wheel and the second wheel move along the rail by contacting in order.

6 Claims, 10 Drawing Sheets

OBJECT CONVEYING SYSTEM

CROSS-REFERENCE TO RELATED APPLICATION

This application claims the priority benefit of Taiwanese application serial no. 113108847, filed on Mar. 11, 2024. The entirety of each of the above-mentioned patent applications is hereby incorporated by reference herein and made a part of this specification.

BACKGROUND

Technical Field

The disclosure relates to an object conveying system, and in particular to an object conveying system that improves the tilt issue when a horizontal mechanism moves.

Description of Related Art

In existing object conveying systems, an object conveying apparatus moves between different stopping points to convey objects. When the object conveying apparatus stops at the stopping point, a vehicle member of the object conveying apparatus is moved to the mounting table located in the horizontal direction to perform operations of picking up and setting down objects. However, when the vehicle member approaches the mounting table, the wheels of the horizontal moving mechanism on the vehicle member (the wheels closer to the mounting table in the horizontal direction) generates impacts and vibrations when entering along the bridging portion of the rail. In order to suppress the vibration, the rail is dropped to a lower position than it originally was, causing the vehicle member to become tilted after completely entering the mounting table.

SUMMARY

The disclosure provides an object conveying system that can correct a tilt angle of a vehicle member and reduce the impact when entering a rail.

The object conveying system of the disclosure includes an object conveying apparatus and a mounting table configured adjacent to the object conveying apparatus. The object conveying apparatus includes a traveling member, a vehicle member, and a transporting member. The traveling member is configured on a traveling rail to move along a traveling direction. The vehicle member is disposed below the traveling member and includes a horizontal moving mechanism that moves in a horizontal direction and a lifting mechanism that moves in an up-down direction. The transporting member is disposed below the lifting mechanism. A rail extending in the horizontal direction is configured between the object conveying apparatus and the mounting table. The horizontal moving mechanism moves back and forth along the rail between the object conveying apparatus and the mounting table in the horizontal direction. The horizontal moving mechanism is provided with a first wheel and a second wheel in a horizontal direction. A horizontal height of a lowest end of an outer peripheral edge of the first wheel is higher than a horizontal height of a lowest end of an outer peripheral edge of the second wheel. When the horizontal moving mechanism moves in the direction away from the object conveying apparatus in the horizontal direction, the first wheel and the second wheel move along the rail by contacting in order.

In an embodiment of the disclosure, a diameter of the first wheel is the same as a diameter of the second wheel. The first wheel is disposed at a higher position relative to the second wheel in the up-down direction, and the first wheel is disposed closer to the outside relative to the second wheel in the horizontal direction.

In an embodiment of the disclosure, the diameter of the first wheel is smaller than the diameter of the second wheel. The center of the first wheel is disposed at the same height as the center of the second wheel in the up-down direction, and the first wheel is disposed at a position closer to the outside relative to the second wheel in the horizontal direction.

In an embodiment of the disclosure, the horizontal moving mechanism further includes a third wheel. The diameter of the third wheel is the same as the diameter of the second wheel, and the center of the third wheel is set at the same horizontal height as the center of the second wheel. The third wheel is disposed at a position closer to the side of the object conveying apparatus relative to the second wheel in the horizontal direction. When the horizontal moving mechanism moves to the mounting table, the second wheel and the third wheel are in contact with the rail.

In an embodiment of the disclosure, the second wheel and the third wheel are provided with an elastic apparatus, and the elastic apparatus stretches along the up-down direction. The rail includes a tilt portion. When the horizontal moving mechanism moves to the mounting table, the tilt portion is at least located between the second wheel and the third wheel in the horizontal direction. Among the elastic apparatus, an elastic coefficient of the elastic apparatus disposed on the second wheel is different from an elastic coefficient of the elastic apparatus disposed on the third wheel.

In an embodiment of the disclosure, the object conveying system further includes multiple support columns. The support columns are disposed between the object conveying apparatus and the mounting table and extend in the up-down direction. The rail is provided with an elastic apparatus, and the elastic apparatus stretches along the up-down direction. The elastic apparatus is disposed between the support column close to the side of the object conveying apparatus among the support columns and the rail. A hinge is disposed at a connection member between the support column on the side away from the object conveying apparatus among the support columns and the rail.

Based on the above, in the object conveying apparatus of the object conveying system of the disclosure, the horizontal height of the lower part of the first wheel on the horizontal moving mechanism of the vehicle member is different from the horizontal height of the lower part of the second wheel, thereby being in contacting with the rail at different timings to lift the horizontal moving mechanism. In this way, when the first wheel and the second wheel in the horizontal moving mechanism approach the mounting table along the rail, the tilt of the vehicle member is corrected. Accordingly, the object conveying system of the disclosure can correct the tilt angle of the vehicle member and reduce the impact when entering the rail.

DESCRIPTION OF THE EMBODIMENTS

Figure 1A:
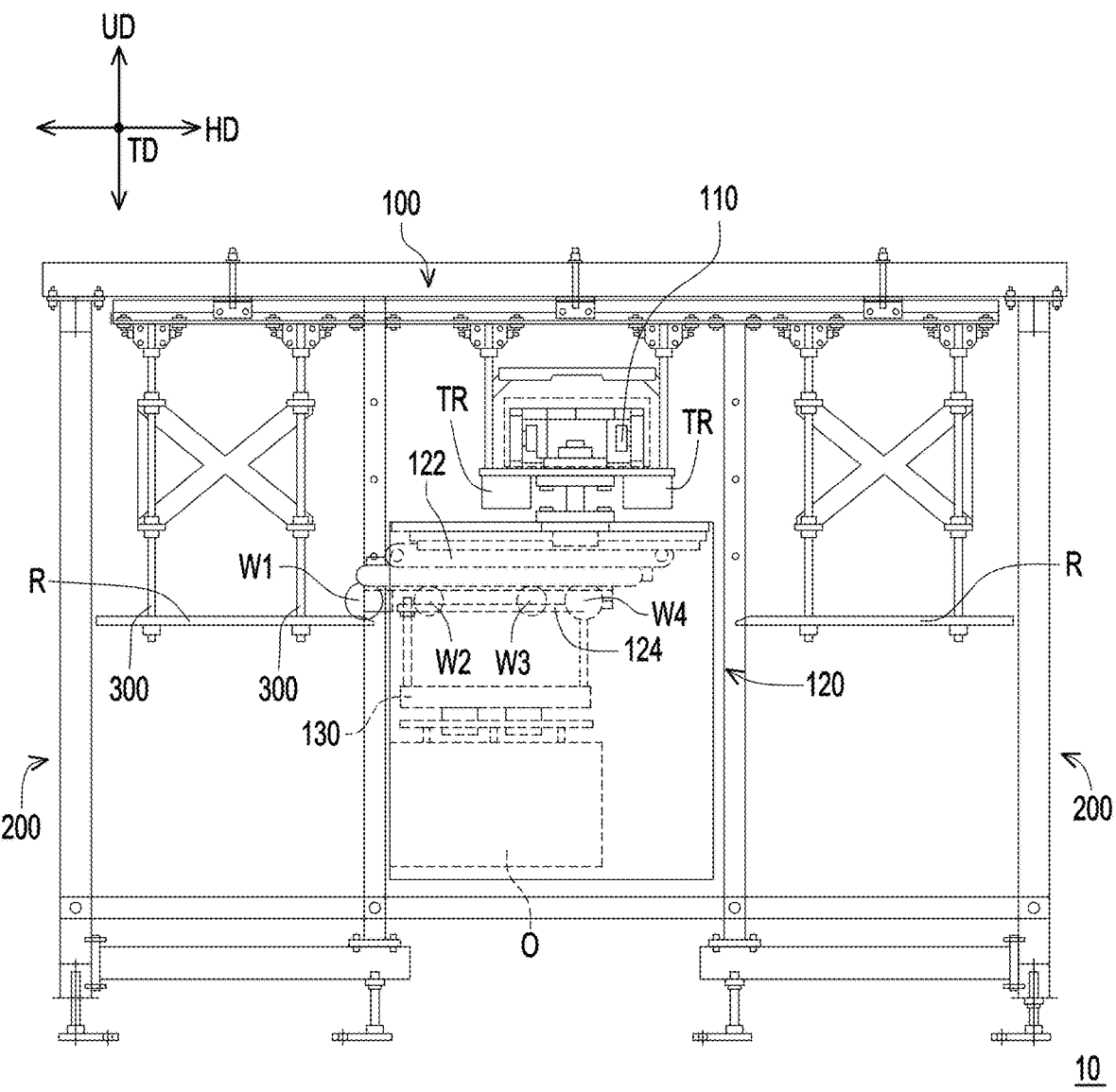
FIGS. 1A and 1B are schematic views of an object conveying system of the disclosure in different operating states.
Figure 1B:
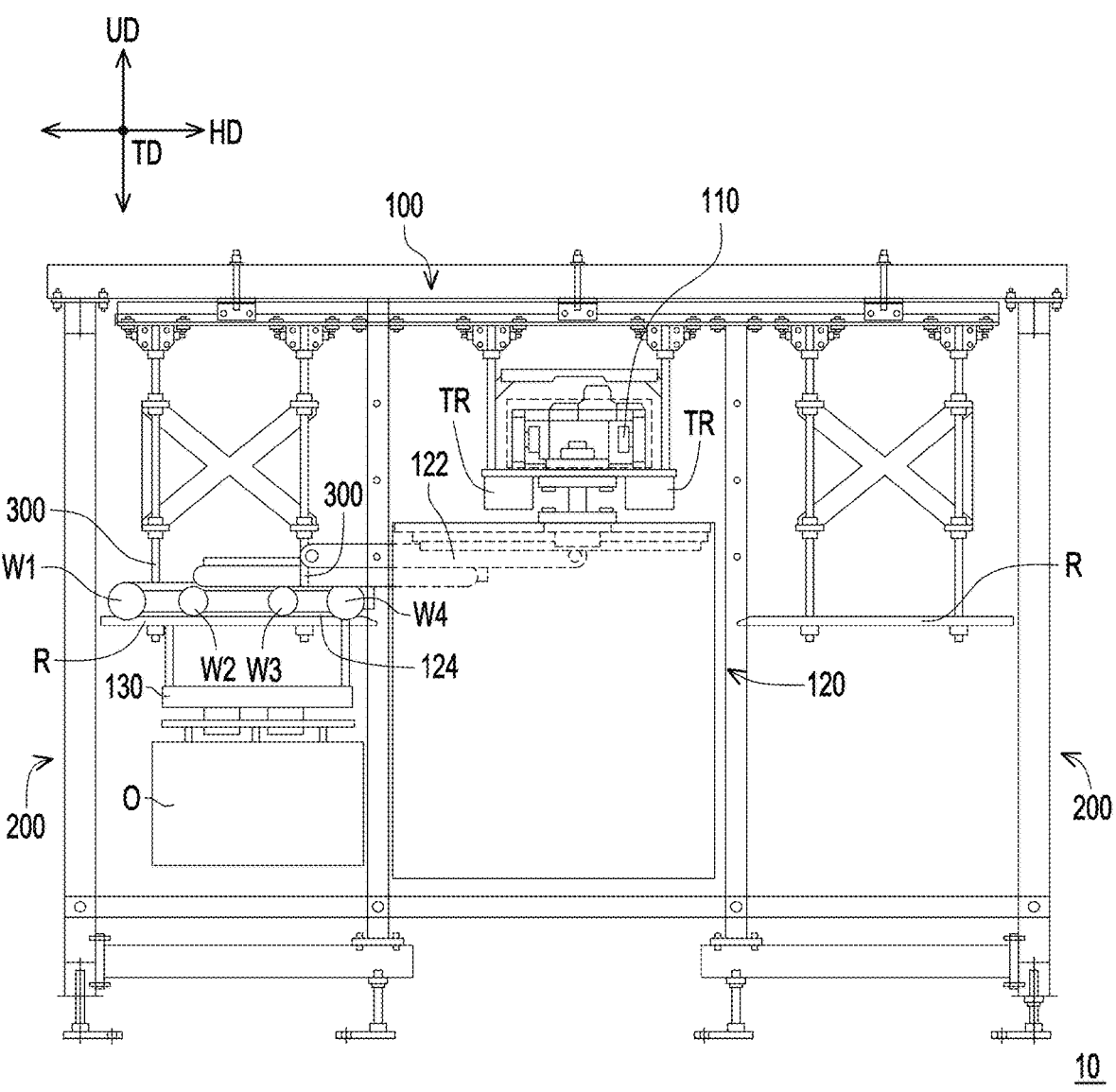
Figure 2:
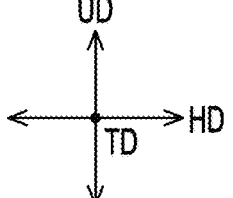
FIG. 2 is a schematic side view of a horizontal moving mechanism of the object conveying apparatus after entering the rail in an embodiment of the disclosure.
Figure 2:
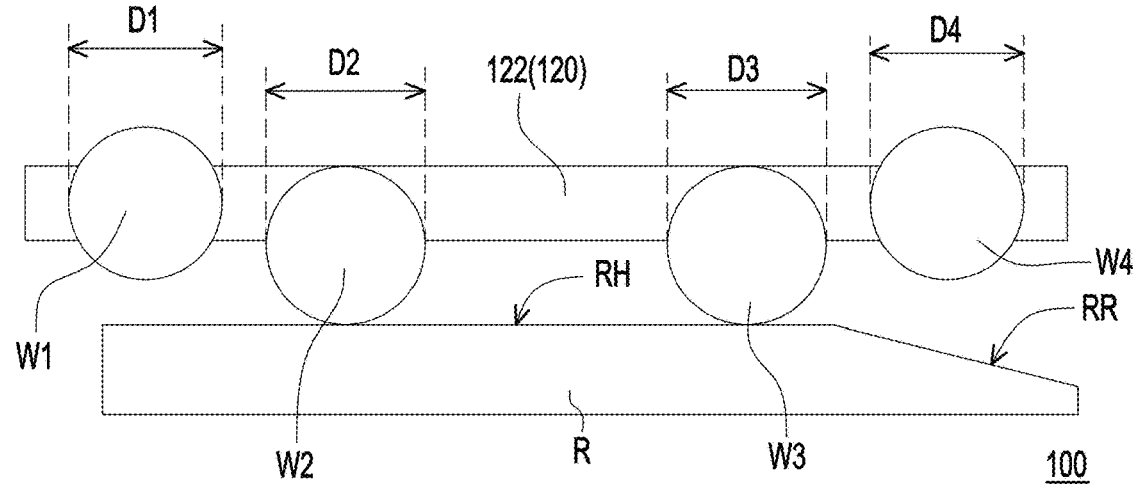

FIGS. 1A and 1B are schematic views of an object conveying system of the disclosure in different operating states. FIG. 2 is a schematic side view of a horizontal moving mechanism of the object conveying apparatus after entering the rail in an embodiment of the disclosure. In this embodiment, an object conveying system 10 conveys an object O (e.g., a wafer, etc.) to various stopping points in a semiconductor factory, for example, to improve overall production efficiency. However, in other embodiments not shown, the object conveying system 10 may also be applied in other working areas suitable for conveying objects, and the disclosure is not limited to the above situation. The object conveying system 10 includes an object conveying apparatus 100, a mounting table 200 configured adjacent to the object conveying apparatus 100, and multiple support columns 300 disposed between the object conveying apparatus 100 and the mounting table 200.

Furthermore, for example, the object conveying apparatus 100 moves along a traveling direction TD (as shown in a vertical direction of FIGS. 1A and 1B) on a traveling rail TR connecting each of the stopping points, and stops between the two mounting tables 200 in a horizontal direction HD (as shown in a left-right direction of FIGS. 1A and 1B). Therefore, when the object conveying apparatus 100 stops at the stopping point, it is equivalent to the mounting table 200 being configured adjacent to the object conveying apparatus 100. That is, in the object conveying system 10, the object conveying apparatus 100 is provided movable and the mounting table 200 is provided fixed. However, in other embodiments not shown, there may be only one mounting table 200 provided according to actual needs, and the disclosure is not limited thereto. The support columns 300 are, for example, fixed on a ceiling, and are suspended between the object conveying apparatus 100 and the mounting table 200. In other embodiments not shown, the support columns 300 may also be fixed on the floor. The structure and operation mode of the object conveying system 10 are further described below.

Referring to FIGS. 1A and 1B, in this embodiment, the object conveying apparatus 100 includes a traveling member 110, a vehicle member 120, and a transporting member 130. The traveling rail TR is disposed above the object conveying apparatus 100 in an up-down direction UD (as shown in the up-down direction of FIGS. 1A and 1B), and the traveling member 110 is configured on the traveling rail TR to move along the traveling direction TD, for example, realizing moving on the traveling rail TR through a driving apparatus that is not shown. The vehicle member 120 is disposed below the traveling member 110 in the up-down direction UD, and includes a horizontal moving mechanism 122 that moves along the horizontal direction HD, and a lifting mechanism 124 that moves along the up-down direction UD. The transporting member 130 is disposed below the lifting mechanism 124, and is used to carry or set down the object O as the lifting mechanism 124 moves downward. Therefore, when the object conveying apparatus 100 stops at a side of the mounting table 200 through the moving of the traveling member 110, the vehicle member 120 moves along the horizontal direction HD through the horizontal moving mechanism 122 and moves along the up-down direction UD through the lifting mechanism 124, allowing the transporting member 130 to approach the mounting table 200. In addition, as shown in FIGS. 1A and 1B, the vehicle member 120 is covered by a shell, and the horizontal moving mechanism 122, the lifting mechanism 124, the transporting member 130, and the object O all enter and exit from the inside of the shell. However, the disclosure is not limited thereto.

Furthermore, in this embodiment, a rail R extending along the horizontal direction HD is configured between the object conveying apparatus 100 and the mounting table 200. As shown in the state change between FIG. 1A and FIG. 1B, the horizontal moving mechanism 122 of the vehicle member 120 moves back and forth along the rail R in the horizontal direction HD between the object conveying apparatus 100 and the mounting table 200 at one side in the horizontal direction HD (that is, the left side of FIG. 1A and FIG. 1B). In other embodiments not shown, the horizontal moving mechanism 122 of the vehicle member 120 may also move back and forth along the rail R facing the horizontal direction HD between the object conveying apparatus 100 the mounting table 200 on another side in the horizontal direction HD (i.e., the right side of FIG. 1A and FIG. 1B). The disclosure is not limited to the content shown in FIG. 1A and FIG. 1B. That is to say, the subsequent description of the relative position and operation between the object conveying apparatus 100 and the mounting table 200 takes the mounting table 200 at one side in the horizontal direction HD as an example, but may also be applied to the mounting table 200 (if any) of another side in the horizontal direction HD, and the moving direction thereof may be adjusted according to needs (as described later).

Referring to FIGS. 1A to 2, in this embodiment, a first wheel W1 is disposed on an end part of the horizontal moving mechanism 122 in the horizontal direction HD (end part of the horizontal moving mechanism 122 close to the left side in the drawing), and a second wheel W2 is disposed on a central part in the horizontal direction HD (at the inner side relative to the first wheel W1 in the horizontal direction HD). Specifically, the first wheel W1 is disposed at one end part of the horizontal moving mechanism 122 in the horizontal direction HD. The central part in the horizontal direction HD is provided with the second wheel W2. That is, from the perspective of FIG. 2, one first wheels W1 and one second wheel W2 may be observed. The first wheel W1 is disposed closer to the outside relative to the second wheel W2 in the horizontal direction HD (i.e., the left side in the drawing). That is, the first wheel W1 is further away from the object conveying apparatus 100 than the second wheel W2. The second wheel W2 is provided to prevent a central part of the horizontal moving mechanism 122 from bending due to weight when only the first wheel W1 or the object conveying apparatus 100 supports the horizontal moving mechanism 122, requiring the second wheel W2 to provide auxiliary support. However, the disclosure is not limited thereto, which may be adjusted according to needs.

Furthermore, as shown in FIG. 2, a horizontal height of a lowest end of an outer peripheral edge of the first wheel W1 is higher than a horizontal height of a lowest end of an outer peripheral edge of the second wheel W2. When the horizontal moving mechanism 122 moves in the direction away from the object conveying apparatus 100 in the horizontal direction HD, the first wheel W1 and the second wheel W2 move along the rail R by contacting in order. Furthermore, when the horizontal moving mechanism 122 moves to the mounting table 200, at least the second wheel W2 is in contact with the rail R. As an example, the rail R includes a horizontal portion RH and a bridging portion RR. The bridging portion RR is disposed on a side close to the object conveying apparatus 100 to reduce the height difference and the impact when the first wheel W1 and the second wheel W2 enter the rail R. However, the disclosure does not limit whether the bridging portion RR is provided or not. The horizontal portion RH is connected to the bridging portion RR and extends horizontally along the horizontal direction HD. Therefore, when the horizontal moving mechanism 122 moves in the direction away from the object conveying apparatus 100 in the horizontal direction HD, the first wheel W1 is in contact with the bridging portion RR of the rail R to move along the bridging portion RR, and the horizontal moving mechanism 122 gradually lifts upward in the up-down direction UD after the first wheel W1 moves along the bridging portion RR. Furthermore, the second wheel W2 is in contact with the bridging portion RR of the rail R to move along the bridging portion RR, and the horizontal moving mechanism 122 is further lifted upward, so that the tilt of the vehicle member 120 begins to be corrected. Furthermore, when the horizontal moving mechanism 122 moves to the mounting table 200, at least the second wheel W2 is in contact with the rail R and stops at the horizontal portion RH, so that the vehicle member 120 is brought into a horizontal state.

It may be seen that in the object conveying apparatus 100 of the object conveying system 10 of this embodiment, the horizontal height of a lower part of the first wheel W1 on the horizontal moving mechanism 122 of the vehicle member 120 is different from the horizontal height of the lower part of the second wheel W2, thereby being in contact the rail R respectively at different times to lift the horizontal moving mechanism 122. In this way, while the first wheel W1 and the second wheel W2 in the horizontal moving mechanism 122 approach the mounting table 200 along the rail R, the tilt of the vehicle member 120 is corrected. Accordingly, the object conveying system 10 of this embodiment can correct the tilt angle of the vehicle member 120 and reduce the impact when entering the rail R. However, although FIG. 2 shows that the horizontal portion RH extending in the horizontal direction HD is disposed on the rail R to maintain the level of the vehicle member 120, the disclosure does not limit the shape of the rail R. For example, in other embodiments not shown, when one first wheel W1 and one second wheel W2 are provided, a tilt portion extending obliquely in a direction away from the object conveying apparatus 100 in the horizontal direction HD and upward in the up-down direction UD may also be disposed on the rail R, so that the first wheel W1 and the second wheel W2 may move along the tilt portion to correct the tilt of the vehicle member 120. The shape of the rail R may be adjusted according to needs. Alternatively, the rail R may also be set to be movable (as explained later) to adjust the horizontal heights of the first wheel W1 and the second wheel W2.

Furthermore, in this embodiment, a diameter D1 of the first wheel W1 is the same as a diameter D2 of the second wheel W2. The first wheel W1 is disposed at a higher position relative to the second wheel W2 in the up-down direction UD. The first wheel W1 is disposed at a position closer to the outside relative to the second wheel W2 in the horizontal direction HD. That is, the center of the first wheel W1 is located higher than the center of the second wheel W2 in the up-down direction UD, so that the lowest end of the outer peripheral edge of the first wheel W1 is located upper than the lowest end of the outer peripheral edge of the second wheel W2 (different horizontal heights). Furthermore, the first wheel W1 is farther away from the object conveying apparatus 100 than the second wheel W2.

Therefore, when the horizontal moving mechanism 122 moves in the direction away from the object conveying apparatus 100 in the horizontal direction HD, the first wheel W1 enters the rail R earlier than the second wheel W2 and is lift upward through the guidance of the rail R (for example, following a tilt direction of the bridging portion RR) while moving along the rail R. Subsequently, the second wheel W2 entering the rail R is also in contact with the rail R and is supported by the rail R. At this time, the horizontal moving mechanism 122 moves with the second wheel W2 as a supporting point (that is, moves along the tilt direction of the bridging portion RR). As a result, the first wheel W1 moves along the tilt direction of the bridging portion RR and is lifted into a suspended state. When the second wheel W2 moves to the horizontal portion RH, the first wheel W1 has a higher horizontal height and is not in contact with the rail R. When the horizontal moving mechanism 122 moves to the mounting table 200, the first wheel W1 is preferably suspended in the air, and the second wheel W2 is preferably stopped at the horizontal portion RH, but is not limited thereto.

In this way, even if during the moving of the horizontal moving mechanism 122, the first wheel W1 before entering the rail R is located at a lower position than the second wheel W2 due to the influence of gravity, the first wheel W1 may still be lifted upward with the assistance of the rail R (for example, the bridging portion RR) after entering the rail R. When the horizontal moving mechanism 122 stops at the side of the mounting table 200, it is preferable that the second wheel W2 stops at the horizontal portion RH (as shown in FIG. 2) after the tilt correction of the rail R, so that the vehicle member 120 becomes horizontal, but the disclosure is not limited thereto. Accordingly, the object conveying system 10 of this embodiment can correct the tilt angle of the vehicle member 120 and reduce the impact when entering the rail R.

In addition, in this embodiment, the horizontal moving mechanism 122 further includes a third wheel W3. A diameter D3 of the third wheel W3 is the same as the diameter D2 of the second wheel W2. The third wheel W3 is at the same position as the second wheel W2 in the up-down direction UD. The third wheel W3 is disposed at a position closer to the side of the object conveying apparatus 100 relative to the second wheel W2 in the horizontal direction HD. That is, the center of the third wheel W3 is set at the same horizontal height as the center of the second wheel W2, so that the lowest end of the outer peripheral edge of the third wheel W3 is at the same horizontal height as the lowest end of the outer peripheral edge of the second wheel W2.

Therefore, when the horizontal moving mechanism 122 moves in the direction away from the object conveying apparatus 100 in the horizontal direction HD, the second wheel W2 enters the rail R earlier than the third wheel W3 and is lifted upwards through the guidance of the rail R (for example, along the tilt direction of the bridging portion RR) while moving along the rail R. Subsequently, the third wheel W3 entering the rail R is also in contact with the rail R and is supported by the rail R. At this time, the second wheel W2 moves along the horizontal portion RH, and the third wheel W3 moves along the bridging portion RR. When the horizontal moving mechanism 122 moves to the mounting table 200, the second wheel W2 and the third wheel W3 are at the same horizontal height. That is, both of the second wheel W2 and the third wheel W3 stay on the horizontal portion RH.

In this way, when the horizontal moving mechanism 122 stops on the side of the mounting table 200, the vehicle member 120 is supported at the same horizontal height by the second wheel W2 and the third wheel W3, thereby being formed into the horizontal state. Accordingly, the object conveying system 10 of this embodiment can stably maintain horizontal when stopped.

In addition, in this embodiment, the horizontal moving mechanism 122 further includes a fourth wheel W4. A diameter D4 of the fourth wheel W4 is the same as the diameter D1 of the first wheel W1. The fourth wheel W4 is disposed at the same position as the first wheel W1 in the up-down direction UD and at a higher position relative to the third wheel W3 in the up-down direction UD. The fourth wheel W4 is disposed closer to the inside relative to the third wheel W3 in the up-down direction UD. That is, the center of the fourth wheel W4 is at the same position as the first wheel W1 in the up-down direction UD, and is higher than the center of the third wheel W3 in the up-down direction UD, so that the lowest end of the outer peripheral edge of the fourth wheel W4 is at the same horizontal height as the lowest end of the outer peripheral edge of the first wheel W1, and is located upper than the lowest end of the outer peripheral edge of the third wheel W3 (different horizontal heights). Furthermore, the fourth wheel W4 is closer to the object conveying apparatus 100 relative to the third wheel W3.

Therefore, when the horizontal moving mechanism 122 moves in the direction away from the object conveying apparatus 100 in the horizontal direction HD, the third wheel W3 enters the rail R earlier than the fourth wheel W4 and is lifted upward through the guidance of the rail R (for example, following the tilt direction of the bridging portion RR) while moving along the rail R. Due to the height difference between the third wheel W3 and the fourth wheel W4, the fourth wheel W4 is not in contact with the rail R. When the horizontal moving mechanism 122 moves to the mounting table 200, the fourth wheel W4 is preferably suspended, and the third wheel W3 is preferably stopped at the horizontal portion RH, but is not limited thereto.

However, the disclosure does not limit the diameter, the center position, and the relative position, etc. of the first wheel W1, the second wheel W2, the third wheel W3, and the fourth wheel W4, which may be adjusted according to needs. That is, when the horizontal moving mechanism 122 moves in the direction opposite to the direction illustrated in the drawing, the functions of the first wheel W1 and the fourth wheel W4 are instantly exchanged, and the functions of the third wheel W3 and the second wheel W2 are instantly exchanged. In other words, the first wheel W1, the second wheel W2, the third wheel W3, and the fourth wheel W4 are determined by the moving direction of the horizontal moving mechanism 122.

Since the functions of the first wheel W1 and the fourth wheel W4, and the third wheel W3 and the second wheel W2 are roughly the same, with only differences in relative positions, the following modified examples are for simplicity of explanation, only taking the modifications of the first wheel W1 and the second wheel W2 an example.

Figure 3:
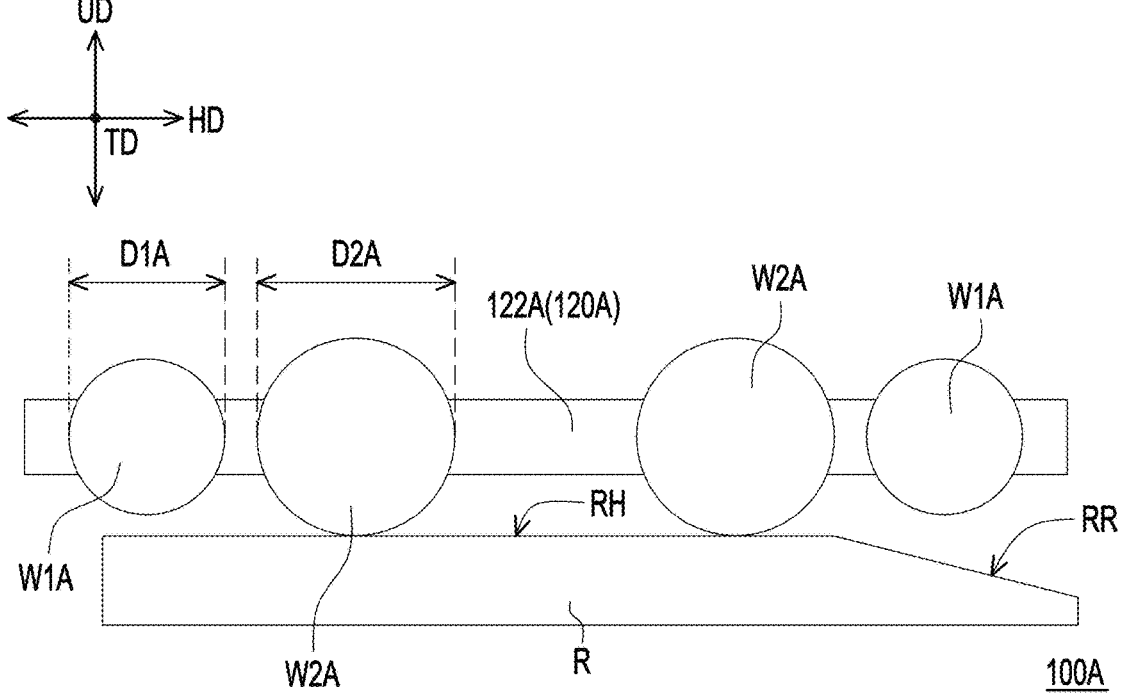
FIG. 3 is a schematic side view of the horizontal moving mechanism of a modified embodiment of FIG. 2 after entering the rail.

FIG. 3 is a schematic side view of the horizontal moving mechanism of the modified embodiment of FIG. 2 after entering the rail. In this modified embodiment, a vehicle member 120A of an object conveying apparatus 100A is also applicable to the object conveying system 10 and the mounting table 200 shown in FIGS. 1A and 1B. That is, when a the horizontal moving mechanism 122A of the vehicle member 120A moves in the direction away from the object conveying apparatus 100A in the horizontal direction HD, a first wheel W1A and a second wheel W2A move along the rail R. Furthermore, when the horizontal moving mechanism 122A moves to the mounting table 200, the horizontal height of the portion where the first wheel W1A is in contact with the rail R is different from the horizontal height of the portion where the second wheel W2A is in contact with the rail R. Compared with the previous embodiment shown in FIG. 2, the configuration of the first wheel W1A and the second wheel W2A of the horizontal moving mechanism 122A of the vehicle member 120A in this embodiment is slightly different. For other unexplained structures, please refer to the description of the foregoing embodiments, which are not repeated herein.

Referring to FIG. 3, in this modified embodiment, the first wheel W1A of the horizontal moving mechanism 122A of the vehicle member 120A is closer to the outside than the second wheel W2A in the horizontal direction HD, and a diameter D1A of the first wheel W1A is smaller than a diameter D2A of the second wheel W2A. Furthermore, the center of the first wheel W1A is disposed at the same height as the center of the second wheel W2A in the up-down direction UD. That is, in response to the vehicle member 120A being horizontal, with the center of the first wheel W1A and the center of the second wheel W2A as the reference (the same height), the lowest end of the outer peripheral edge of the first wheel W1A with the diameter D1A is located upper than the lowest end of the outer peripheral edge of the second wheel W2A with the diameter D2A (different horizontal heights).

Therefore, when the horizontal moving mechanism 122A moves in the direction away from the object conveying apparatus 100A in the horizontal direction HD, the first wheel W1A enters the rail R earlier than the second wheel W2A, and is lifted upward through the guidance of the rail R (for example, following the tilt direction of the bridging portion RR) while moving along the rail R. Subsequently, the second wheel W2A entering the rail R is also in contact with the rail R and is supported by the rail R. At this time, the horizontal moving mechanism 122A moves with the second wheel W2A as a supporting point (that is, moves along the tilt direction of the bridging portion RR). As a result, the first wheel W1A moves along the tilt direction of the bridging portion RR and is lifted into a suspended state. When the second wheel W2A moves to the horizontal portion RH, the first wheel W1A has a higher horizontal height and is not in contact with the rail R. When the horizontal moving mechanism 122A moves to the mounting table 200, the first wheel W1A is preferably suspended, and the second wheel W2A is preferably stopped at the horizontal portion RH, but is not limited thereto.

In this way, even if during the moving of the horizontal moving mechanism 122A, the first wheel W1A before entering the rail R is located at a lower position than the second wheel W2A due to the influence of gravity, the first wheel W1A may still be lifted upward with the assistance of the rail R (for example, the bridging portion RR) after entering the rail R. When the horizontal moving mechanism 122A stops on the side of the mounting table 200, it is preferable that the second wheel W2A stops on the horizontal portion RH (as shown in FIG. 3) after the tilt correction of the rail R, so that the vehicle member 120A is formed horizontal, but the disclosure is not limited thereto. Accordingly, the object conveying system 10 of this embodiment can correct the tilt angle of the vehicle member 120A and reduce the impact when entering the rail R. However, the disclosure does not limit the diameter, the center position, the relative position, etc. of the first wheel W1A and the second wheel W2A, which may be adjusted according to needs.

Another embodiment of the disclosure is described in detail below.

Figure 4A:
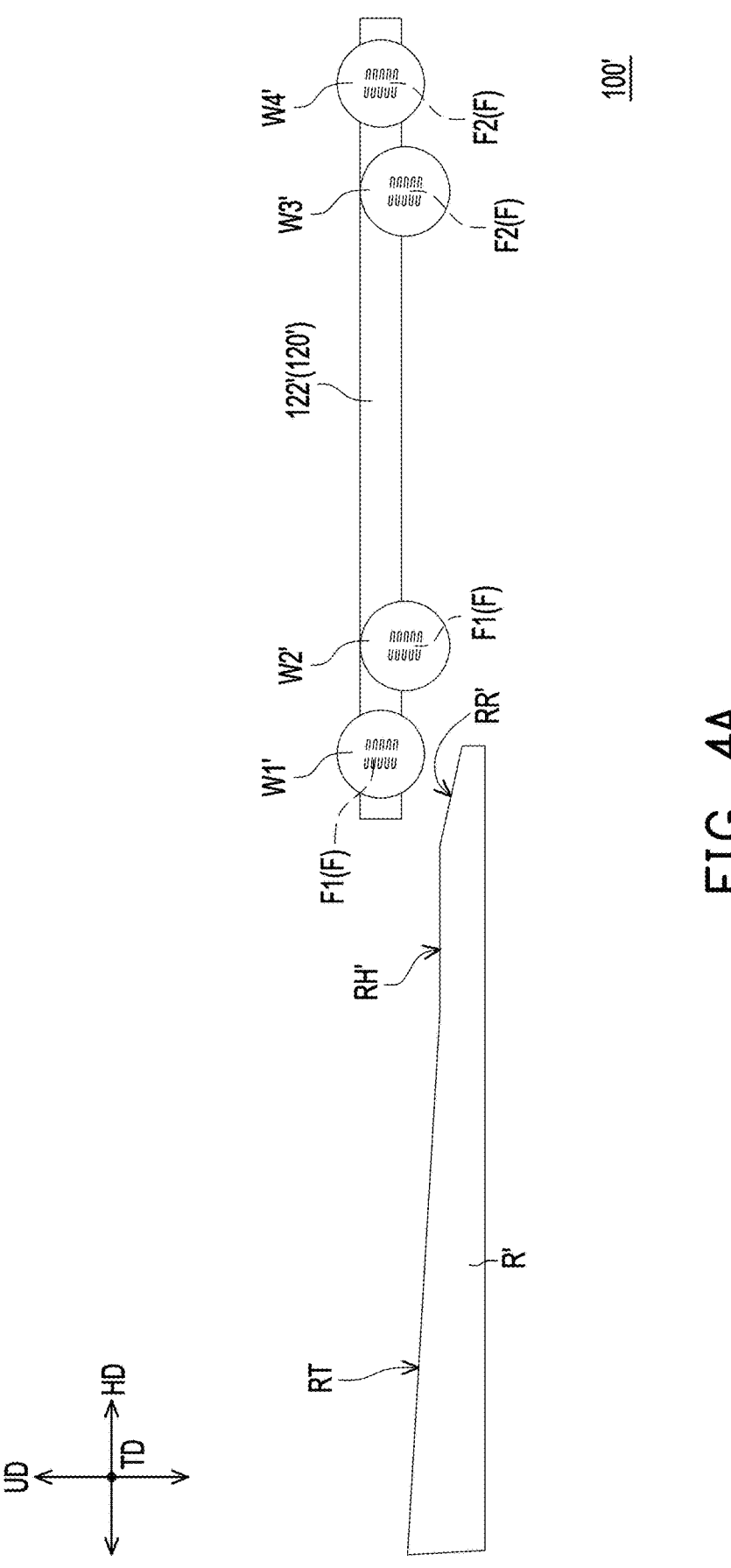
FIGS. 4A to 4C are schematic side views of the process of the horizontal moving mechanism of the object conveying apparatus entering the rail in another embodiment of the disclosure.
Figure 4B:
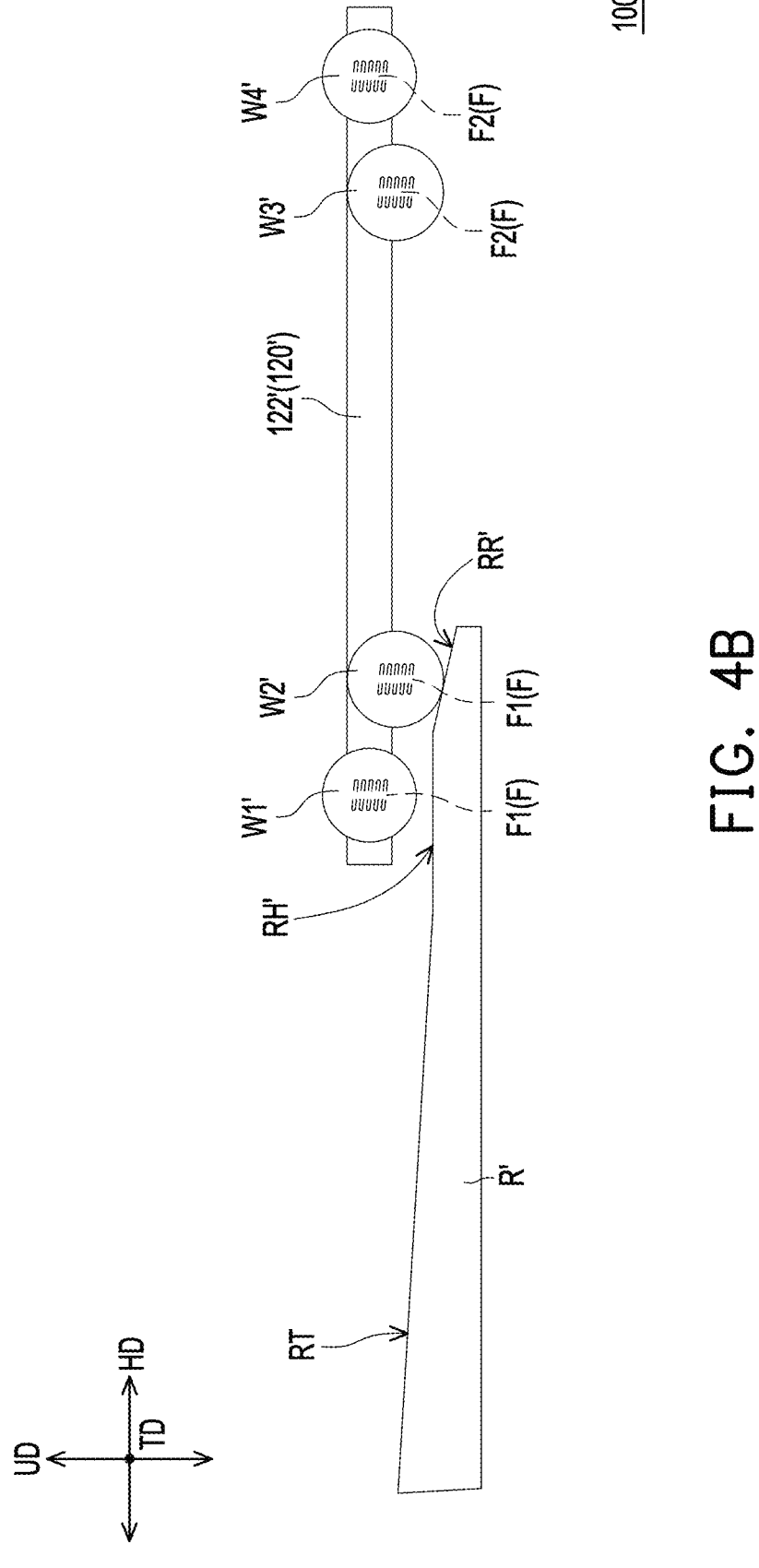
Figure 4C:
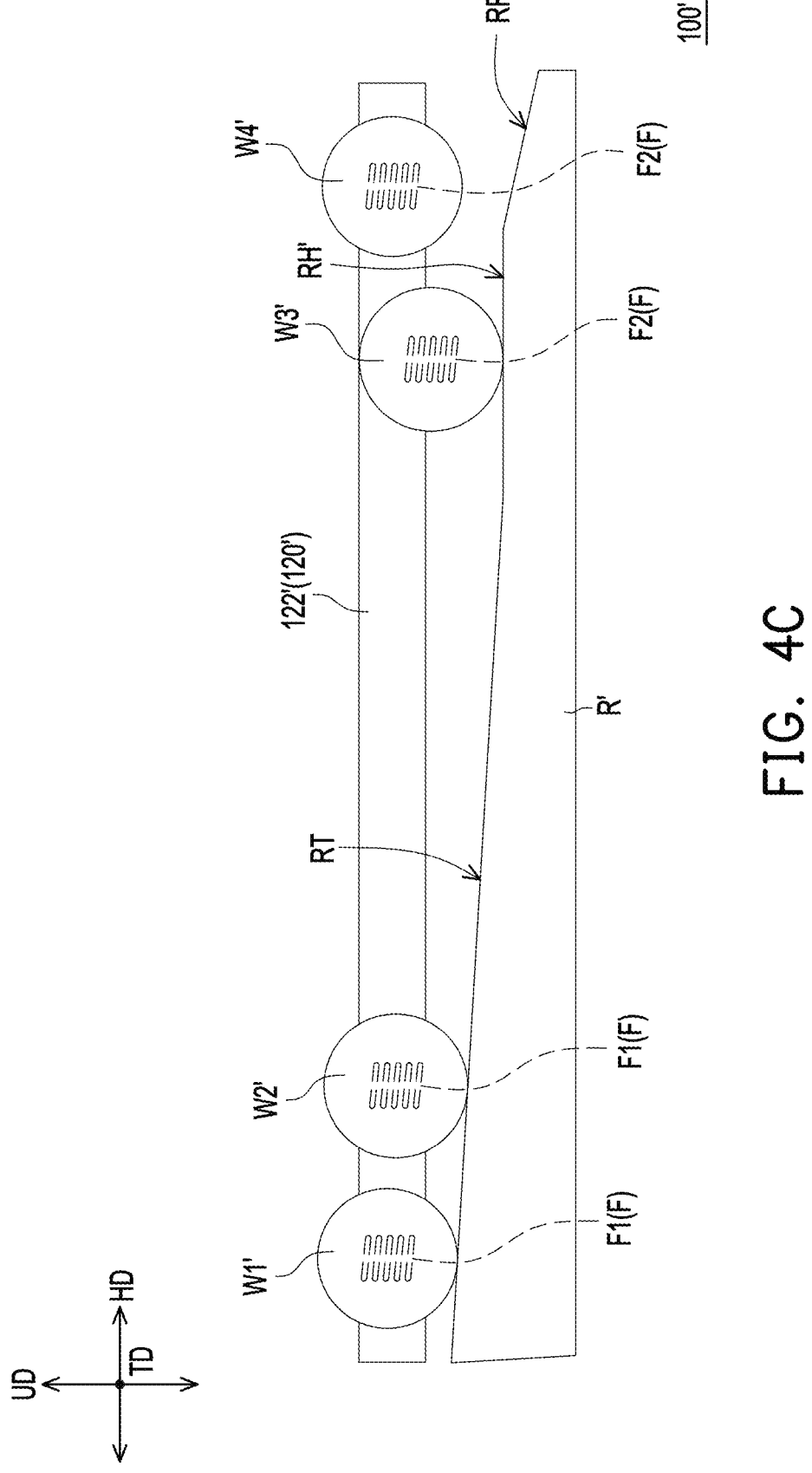

FIGS. 4A to 4C are schematic side views of the process of the horizontal moving mechanism of the object conveying apparatus entering the rail in another embodiment of the disclosure. In this embodiment, a vehicle member 120' of an object conveying apparatus 100' is also applicable to the object conveying system 10 and the mounting table 200 shown in FIGS. 1A and 1B. That is, the horizontal height of the lowest ends of the outer peripheral edges of a first wheel W1' and a fourth wheel W4' of a horizontal moving mechanism 122' of the vehicle member 120' is different from the horizontal height of the lowest ends of the outer peripheral edges of a second wheel W2' and a third wheel W3'. When the horizontal moving mechanism 122' moves in the direction away from the object conveying apparatus 100' in the horizontal direction HD, the first wheel W1', the second wheel W2', and the third wheel W3' move along a rail R' by contacting in order. Moreover, when the horizontal moving mechanism 122' moves to the mounting table 200, the first wheel W1' and the second wheel W2' on the front side (here, the left side in the drawing, depending on the moving direction of the horizontal moving mechanism 122') and the third wheel W3' on the rear side (here, the right side in the drawing, depending on the moving direction of the horizontal moving mechanism 122') are all in contact with the rail R'. Compared with the embodiment shown in FIGS. 2 and 3, the wheels of the horizontal moving mechanism 122' of this embodiment are further provided with an elastic apparatus F, and the rail R' is further provided with a tilt portion RT. Moreover, the elastic apparatus F may be disposed on at least one of the first wheel W1', the second wheel W2', the third wheel W3', the fourth wheel W4', or the rail R'. For other unexplained structures, please refer to the description of the foregoing embodiments, which are not repeated herein.

Referring to FIGS. 4A to 4C, in this embodiment, the elastic apparatus F is disposed on the first wheel W1', the second wheel W2', the third wheel W3', and the fourth wheel W4'. Specifically, the first wheel W1' and the second wheel W2' on the front side are connected to the horizontal moving mechanism 122' of the vehicle member 120' through a first elastic apparatus F1, and the third wheel W3' and the fourth wheel W4' on the rear side are connected to the horizontal moving mechanism 122' of the vehicle member 120' through a second elastic apparatus F2. The first elastic apparatus F1 and the second elastic apparatus F2 stretch along the up-down direction UD when receiving the force in the up-down direction UD. The first elastic apparatus F1 and the second elastic apparatus F2 are springs, for example, but the disclosure is not limited thereto.

As shown in FIG. 4A, when the horizontal moving mechanism 122' of the vehicle member 120' moves in the direction away from the object conveying apparatus 100' in the horizontal direction HD, the front side of the vehicle member 120' sinks further than the other side due to the influence of gravity before the first wheel W1' and the second wheel W2' enter the rail R'. At this time, the first wheel W1', the second wheel W2', the third wheel W3', and the fourth wheel W4' are suspended and supported by the first elastic apparatus F1 and the second elastic apparatus F2.

Next, as shown in FIG. 4B, since the first wheel W1' is disposed closer to the outside relative the second wheel W2' in the horizontal direction HD, when the horizontal moving mechanism 122' moves in the direction away from the object conveying apparatus 100' in the horizontal direction HD, the first wheel W1' enters the rail R' earlier than the second wheel W2'. The first wheel W1' is in contact with the rail R' after entering the rail R', causing the first elastic apparatus F1 connected to the first wheel W1' to receive force. Therefore, the first elastic apparatus F1 is compressed along the up-down direction UD. The first wheel W1' is supported by the rail R' (for example, the bridging portion RR) and is slightly lifted upward in the up-down direction UD.

Then, as shown in FIG. 4C, the first wheel W1' enters the rail R' and moves sequentially along a bridging portion RR', a horizontal portion RH', and the tilt portion RT (the shape of the rail R' is not limited thereto) and is gradually lifted to get tilt correction. The tilt portion RT is disposed to extend obliquely in the direction away from the object conveying apparatus 100' in the horizontal direction HD and upward in the up-down direction UD. The horizontal portion RH' is disposed between the tilt portion RT and the bridging portion RR'. Moreover, the second wheel W2' that subsequently enters the rail R is also in contact with the rail R and is supported by the rail R, causing the first elastic apparatus F1 connected to the second wheel W2' to receive force. Therefore, the first elastic apparatus F1 is compressed along the up-down direction UD. The second wheel W2' is supported by the rail R and slightly lifted upward in the up-down direction UD.

As the vehicle member 120' approaches the mounting table 200, the third wheel W3' also enters the rail R and is supported by the rail R. When the horizontal moving mechanism 122' moves to the mounting table 200, the first wheel W1' and the second wheel W2' preferably stay at the tilt portion RT. The third wheel W3' preferably stays at the horizontal portion RH'. The fourth wheel W4' is preferably suspended. However, the disclosure is not limited thereto.

Furthermore, in this embodiment, parameters such as the tilt angle of the rail R' and the constants of the elastic apparatus F are set so that the vehicle member 120' is in a horizontal state when the horizontal moving mechanism 122' moves to the mounting table 200 and stops. That is, it is preferable to set an elastic coefficient of the first elastic apparatus F1 on the front side to be different from the elastic coefficient of the second elastic apparatus F2 on the rear side. In the case of FIG. 4C of this embodiment, the elastic coefficient of the first elastic apparatus F1 of the first wheel W1' and the second wheel W2' is set to be smaller than the elastic coefficient of the second elastic apparatus F2 of the third wheel W3' and the fourth wheel W4', so that a compression amount of the first elastic apparatus F1 is slightly greater than the compression amount of the second elastic apparatus F2. The first wheel W1' and the second wheel W2' are in contact with the tilt portion RT of the rail R. The third wheel W3' is in contact with the horizontal portion RH' of the rail R. Thereby, the horizontal moving mechanism 122' is in a horizontal state, but the disclosure is not limited thereto.

It may be seen that in the object conveying apparatus 100' of this embodiment, not only the tilt of the vehicle member 120' may be corrected through the setting of the horizontal height positions of the first wheel W1' and the second wheel W2' and the guidance of the rail R, after the horizontal moving mechanism 122' enters the rail R along the horizontal direction HD, the elastic apparatus F of the first wheel W1', the second wheel W2', the third wheel W3', and the fourth wheel W4' disposed on the horizontal moving mechanism 122' acts as a shock absorber to reduce the impact when entering rail R. Furthermore, through the different elastic coefficients between the first elastic apparatus F1 and the second elastic apparatus F2 and the tilt portion RT, the tilt of the vehicle member 120' may be lifted along the rail and be corrected. Accordingly, the object conveying apparatus 100' of this embodiment can correct the tilt angle of the vehicle member 120' and reduce the impact when entering the rail R. In addition, although this embodiment is based on the application of the elastic apparatus F in the horizontal moving mechanism of the first wheel and the second wheel with the same diameter and the different horizontal heights of the center similar to FIG. 2 as an example, the elastic apparatus F may also be applied to the horizontal moving mechanism with the first wheel and the second wheel with different diameters and the same horizontal height of the center similar to FIG. 3. The disclosure is not limited thereto.

FIGS. 5A to 5D are schematic side views of the process of the horizontal moving mechanism entering the rail according to the modified embodiment of FIGS. 4A to 4C. In this modified embodiment, a vehicle member 120A' of an object conveying apparatus 100A' is also applicable to the object conveying system 10 and the mounting table 200 shown in FIGS. 1A and 1B. That is, the horizontal height of the lower part of a first wheel W1A' of a horizontal moving mechanism 122A' of the vehicle member 120A' is different from the horizontal height of the lower part of a second wheel W2A'. When the object conveying apparatus 100A' moves in the direction away from the object conveying apparatus 100A' in the horizontal direction HD, the first wheel W1A' and the second wheel W2A' move along the rail R by sequentially contacting the rail R'. Furthermore, when the horizontal moving mechanism 122A' moves to the mounting table 200, at least the second wheel W2A' is in contact with the rail R. Compared with the previous embodiment shown in FIGS. 4A to 4C, an elastic apparatus F' of this modified embodiment is configured on the rail R, and the rail R does not have the tilt portion RT. For other unexplained structures, please refer to the description of the foregoing embodiments, which are not be repeated herein.

Referring to FIG. 1A and FIG. 5A to FIG. 5D, in this modified embodiment, the support columns 300 extend along the up-down direction UD. The rail R and the mounting table 200 are installed on the support column 300, and the rail R is, for example, disposed at the lower part of the support column 300 in the up-down direction UD. As an example, multiple support columns 300 are disposed (two are disposed in this modified embodiment, but is not limited thereto). The elastic apparatus F' is disposed between the support column 300 on the side close to the object conveying apparatus 100A' in the horizontal direction HD (i.e., the right side in the drawing) and the rail R. The elastic apparatus F' stretches along the up-down direction UD when receiving the force in the up-down direction UD. The elastic apparatus F' is, for example, a spring, but the disclosure is not limited thereto. Furthermore, a hinge H is disposed at a connection member between the support column 300 on the side away from the object conveying apparatus 100A' in the horizontal direction HD (i.e., the left side in the drawing) and the rail R. In this way, the rail R may rotate around the hinge H, and a rotating arm is formed between an end of the rail R close to the object conveying apparatus 100A' (that is, the end where the elastic apparatus F' is located, the right side in the drawing) and the hinge H.

Figure 5A:
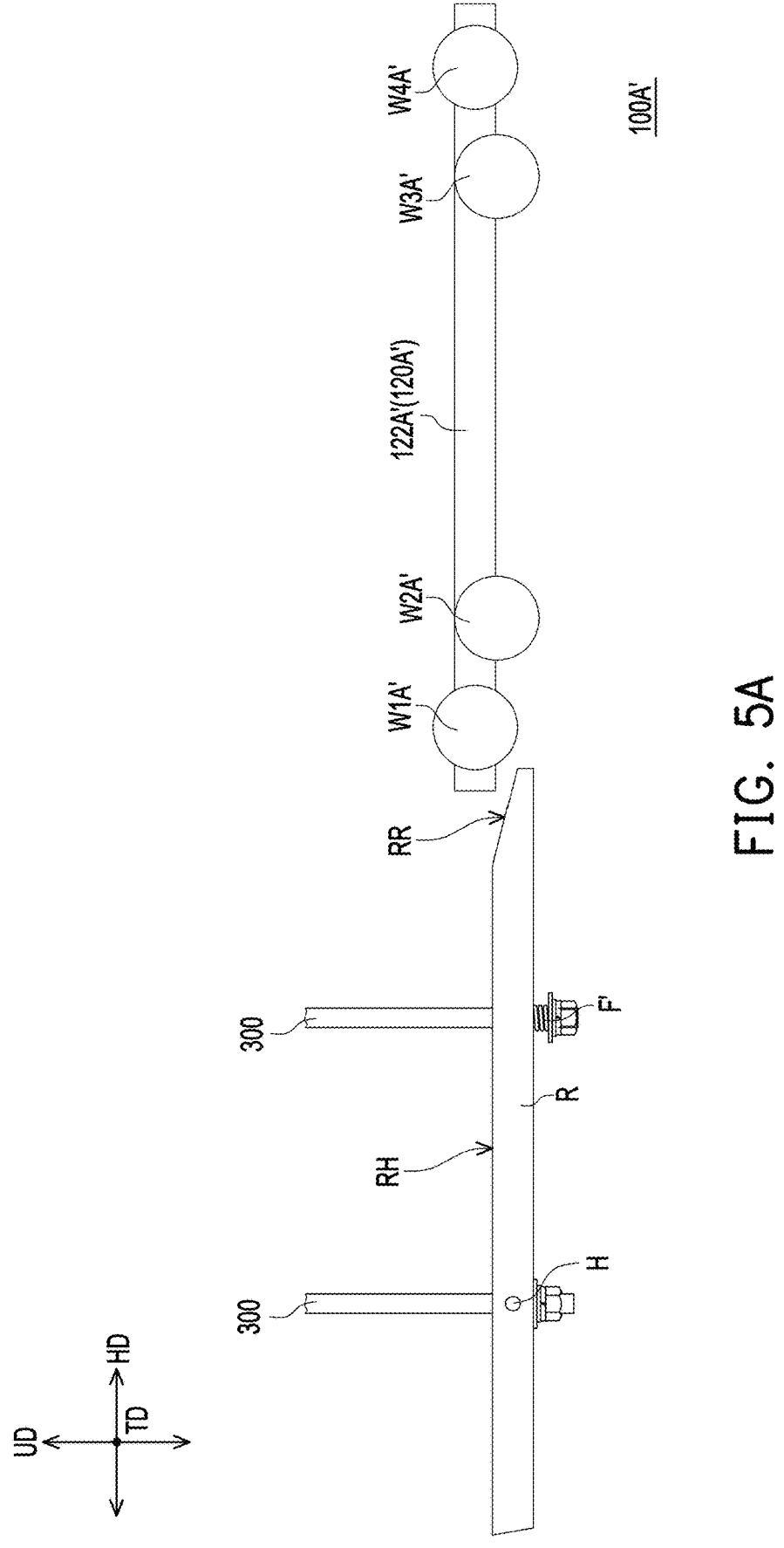
FIGS. 5A to 5D are schematic side views of the process of the horizontal moving mechanism entering the rail according to the modified embodiment of FIGS. 4A to 4C.

As shown in FIG. 5A, when the horizontal moving mechanism 122A' of the vehicle member 120A' moves in the direction away from the object conveying apparatus 100A' in the horizontal direction HD, the front side of the vehicle member 120A' sinks further than the other side due to the influence of gravity before the first wheel W1A' and the second wheel W2A' enter the rail R. At this time, an end of the rail R is supported by the elastic apparatus F'.

Figure 5B:
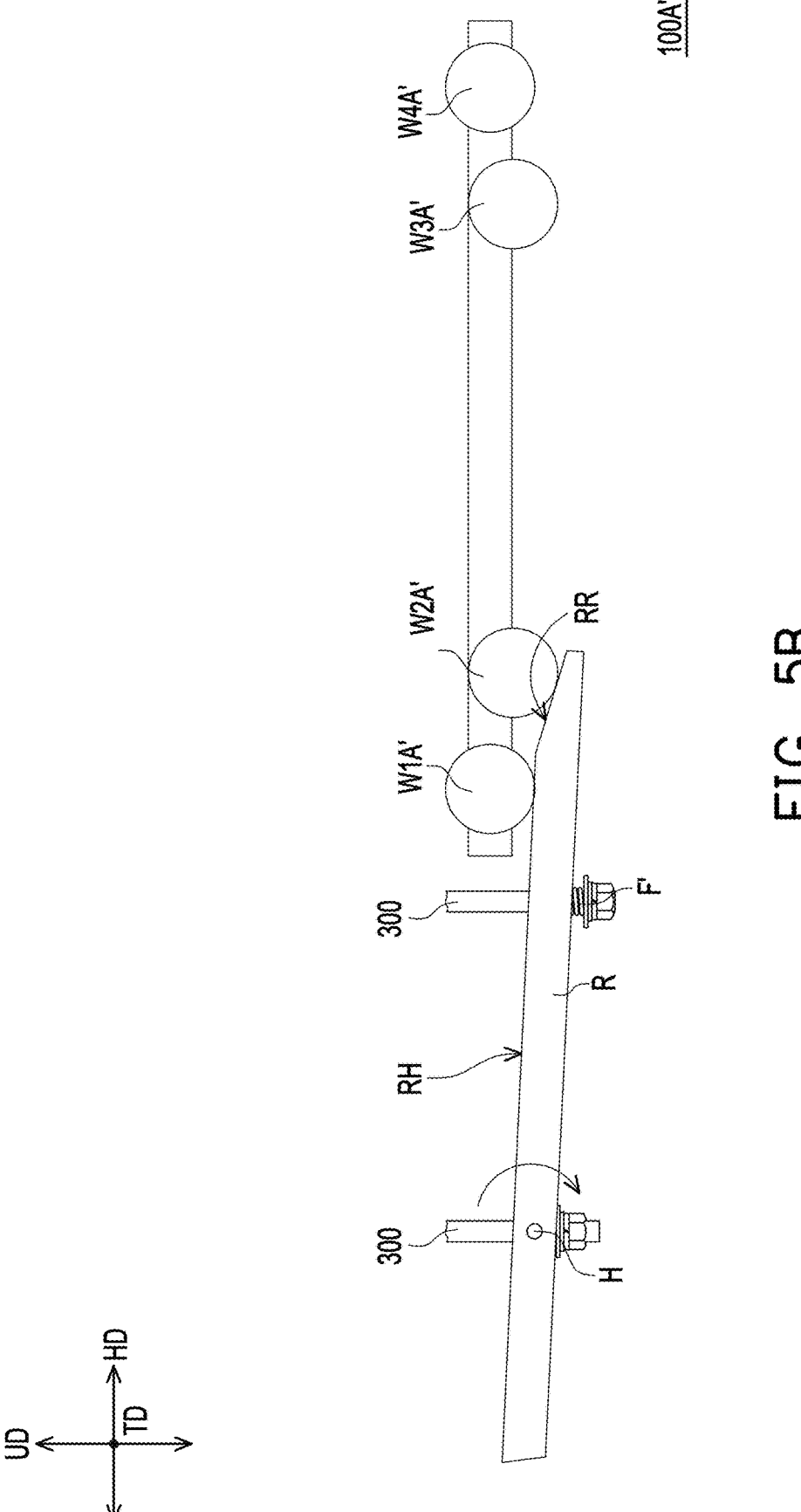

Next, as shown in FIG. 5B, since the first wheel W1A' is disposed closer to the outside relative to the second wheel W2A' in the horizontal direction HD (that is, the first wheel W1A' is farther away from the object conveying apparatus 100A' than the second wheel W2A'), so that when the horizontal moving mechanism 122A' moves in the direction away from the object conveying apparatus 100A' in the horizontal direction HD, the first wheel W1A' enters the rail R earlier than the second wheel W2A'. The first wheel W1A' is in contact with an end of the rail R (i.e., the bridging portion RR) after entering the rail R, causing the elastic apparatus F' connected to the rail R to receive force. Therefore, the elastic apparatus F' is compressed along the up-down direction UD. The rail R rotates clockwise around the hinge H, so that the end of the rail R close to the side of the object conveying apparatus 100A' (that is, the end where the elastic apparatus F' is located, the right side in the drawing) moves downward.

Figure 5C:
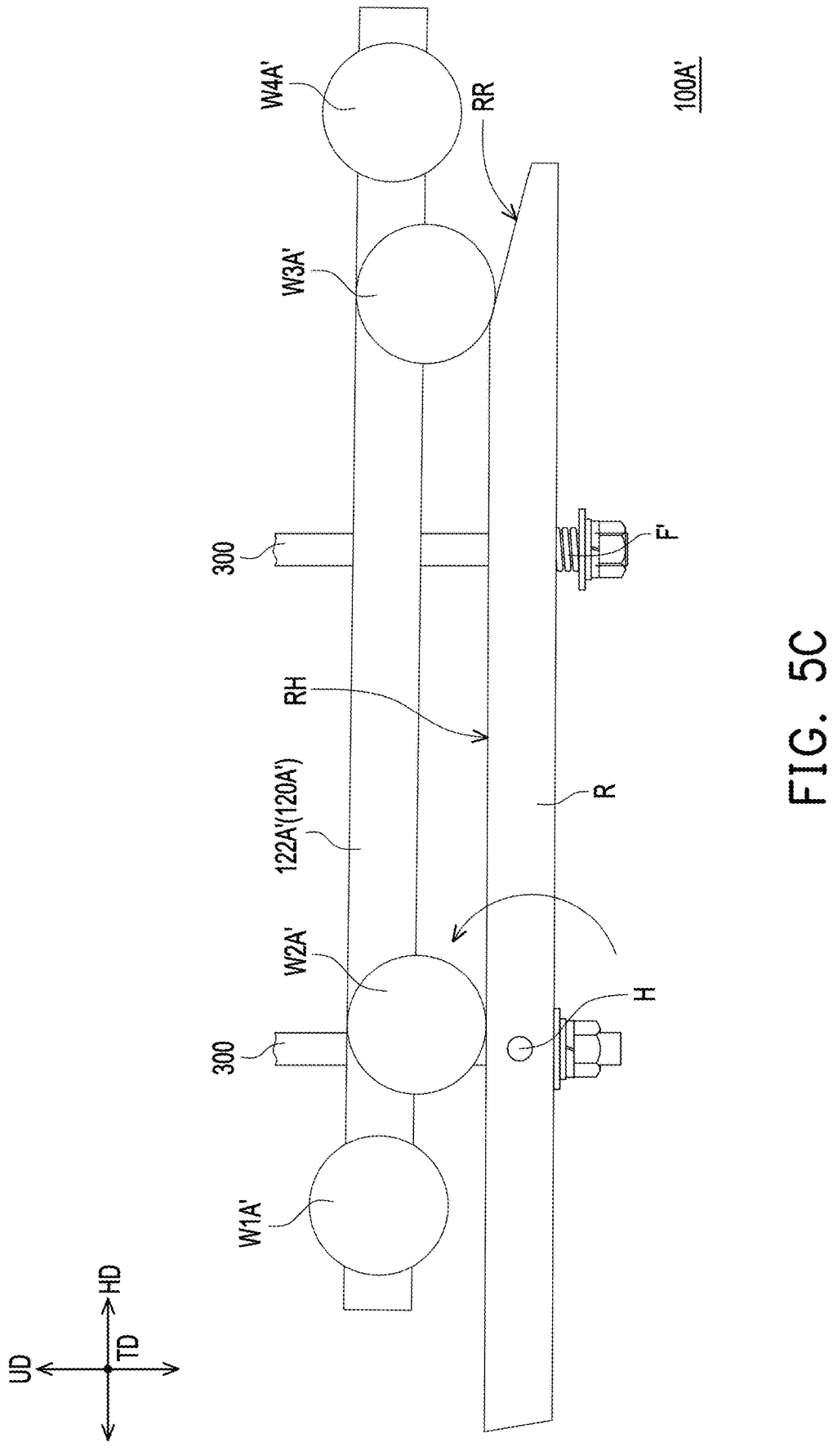

Then, as shown in FIG. 5C, the first wheel W1A' enters the rail R and moves along the rail R. Subsequently, the second wheel W2A' entering the rail R is also in contact with the rail R and is supported by the rail R. At this time, the horizontal moving mechanism 122A' moves with the second wheel W2A' as the supporting point (that is, moving along the tilt direction of the bridging portion RR), so that the first wheel W1A' moves along the tilt direction of the bridging portion RR and is lifted into the suspended state. When the second wheel W2A' moves to the horizontal portion RH, the first wheel W1A' has a higher horizontal height and is not in contact with the rail R. At the same time, as the horizontal moving mechanism 122A' gradually moves away from the object conveying apparatus 100A' (that is, gradually moves to the left side in the drawing), the center of gravity of the horizontal moving mechanism 122A' also gradually moves away from the object conveying apparatus 100A'. That is to say, as the second wheel W2A' moves along the horizontal portion RH of the rail R, the center of gravity of the horizontal moving mechanism 122A' is shifted toward the direction of the hinge H relative to the elastic apparatus F', so that the elastic apparatus F' releases elastic potential energy to give upward thrust in the up-down direction UD. The rail R rotates counterclockwise around the hinge H, so that the end of the rail R close to the object conveying apparatus 100A' (i.e., the end where the elastic apparatus F' is located, the right side in the drawing) moves upward. In this way, during the moving of the second wheel W2A' along the rail R, as the second wheel W2A' gradually moves away from the object conveying apparatus 100A' (that is, gradually moves to the left side in the drawing), the rail R gradually changes toward the horizontal state.

Figure 5D:
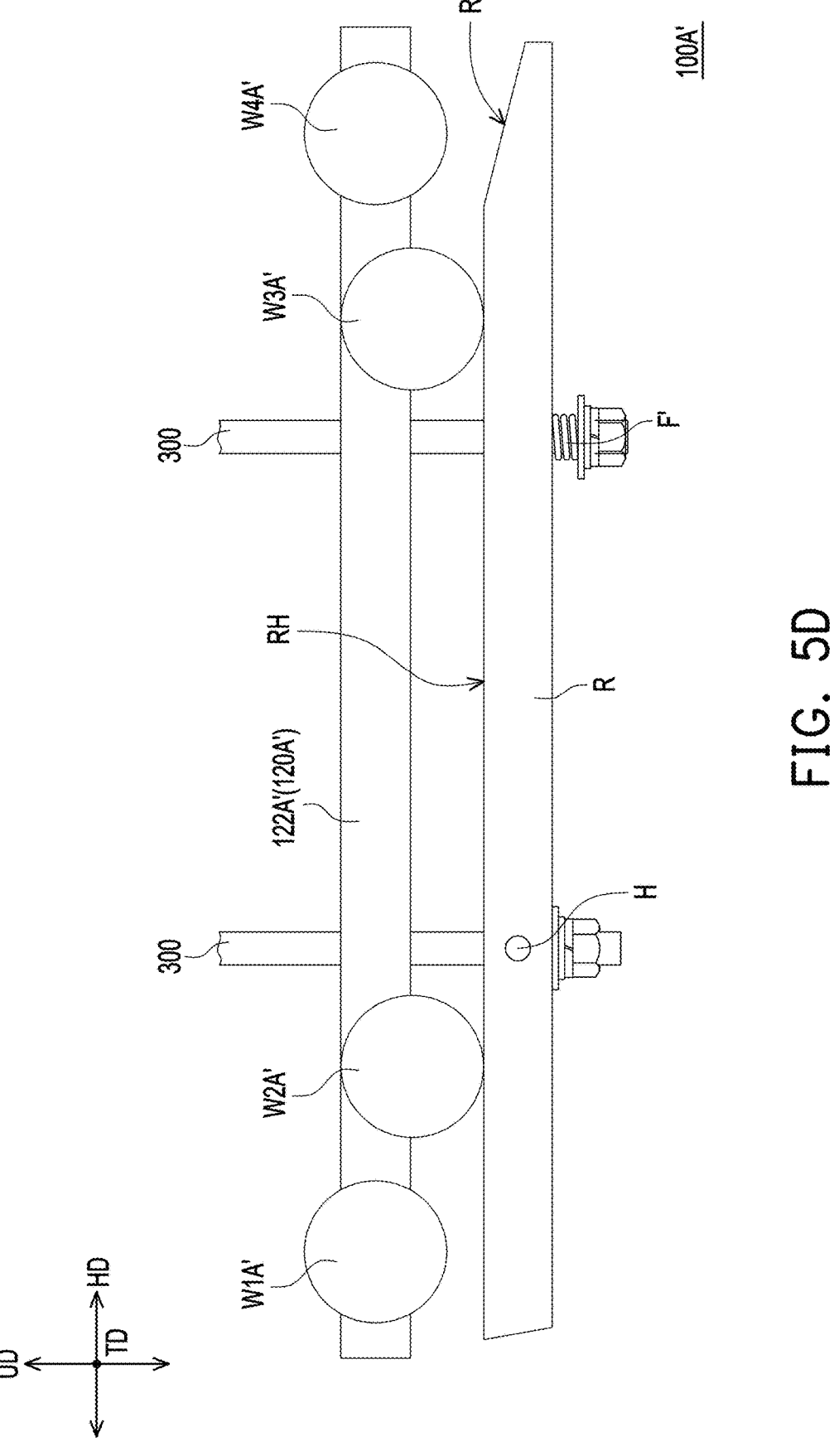

Finally, as shown in FIG. 5D, as the horizontal moving mechanism 122A' moves along the rail R, the third wheel W3A' that subsequently enters the rail R is also in contact with the rail R and is supported by the rail R (the fourth wheel W4A' is also suspended). Furthermore, as the horizontal moving mechanism 122A' gradually moves away from the object conveying apparatus 100A' (that is, gradually moves to the left side in the drawing), the rail R also gradually rotates and adjusts in a counterclockwise direction. The position of the hinge H is set so that when the horizontal moving mechanism 122A' moves to the mounting table 200, the rotation of the rail R around the hinge H is balanced. That is, when the horizontal moving mechanism 122A' of the vehicle member 120A' stops on the mounting table 200, the tilt of the vehicle member 120A' is corrected and becomes a horizontal state, and the second wheel W2A' is in contact with the rail R.

Although the rail R in this modified embodiment is disposed as movable via the hinge H for guiding (lifting up) the first wheel W1A' and the second wheel W2A', the rail R may also be disposed with the tilt portion RT etc., and the disclosure is not limited thereto. As long as the parameters of the rail R and the elastic apparatus F' are set so that the vehicle member 120A' is in a horizontal state while being located on the mounting table 200.

It may be seen that in the object conveying apparatus 100A' of this embodiment, not only the tilt of the vehicle member 120A' can be corrected through the setting of the horizontal height positions of the first wheel W1A' and the second wheel W2A' and the guidance of the rail R, after the horizontal moving mechanism 122A' enters the rail R along the horizontal direction HD, the elastic apparatus F disposed on the rail R acts as a shock absorber to reduce the impact when entering the rail R. Furthermore, adjusting the tilt angle by configuring the rail R as rotating around the hinge H (that is, making the rail R movable) so that the tilt of the vehicle member 120A' can be corrected as moving along the rail R. Accordingly, the object conveying apparatus 100A' of this embodiment can correct the tilt angle of the vehicle member 120A' and reduce the impact when entering the rail R. In addition, although this embodiment takes the application of the elastic apparatus F in the rail corresponding to the horizontal moving mechanism of the first wheel and the second wheel with the same diameter and the different horizontal heights of the center similar to FIG. 2 as an example, the elastic apparatus F may also be applied in the rail corresponding to the horizontal moving mechanism of the first wheel and the second wheel with the different diameters and the same horizontal heights of the center similar to FIG. 3. The disclosure is not limited thereto.

To sum up, in the object conveying apparatus of the object conveying system of the disclosure, the first wheel and the second wheel on the horizontal moving mechanism of the vehicle member are disposed at different horizontal heights, thereby respectively being in contact with the rail at different timings to lift the horizontal moving mechanism. In this way, when the first wheel and the second wheel in the horizontal moving mechanism approach the mounting table along the rail, the tilt of the vehicle member is corrected. Preferably, the diameter and the horizontal height position of the first wheel and the second wheel may also be adjusted, or the elastic apparatus or the hinge (to set the rail as movable), etc. may be provided. Accordingly, the object conveying system of the disclosure can correct the tilt angle of the vehicle member and reduce the impact when entering the rail.

What is claimed is:

1. An object conveying system, comprising an object conveying apparatus and a mounting table configured adjacent to the object conveying apparatus, wherein the object conveying apparatus comprises:
   a traveling member, configured on a traveling rail to move along a traveling direction;
   a vehicle member, disposed below the traveling member and comprising a horizontal moving mechanism moving in a horizontal direction and a lifting mechanism moving in an up-down direction; and
   a transporting member, disposed below the lifting mechanism, wherein
   a rail extending along the horizontal direction is disposed between the object conveying apparatus and the mounting table, the horizontal moving mechanism moves back and forth along the rail between the object conveying apparatus and the mounting table in the horizontal direction, and
   a first wheel and a second wheel are disposed on the horizontal moving mechanism in the horizontal direction, and a horizontal height of a lowest end of an outer peripheral edge of the first wheel is higher than a horizontal height of a lowest end of an outer peripheral edge of the second wheel,
   in response to the horizontal moving mechanism moving in a direction away from the object conveying apparatus in the horizontal direction, the first wheel and the second wheel move along the rail by contacting in order.

2. The object conveying system according to claim 1, wherein
   a diameter of the first wheel is the same as a diameter of the second wheel,
   the first wheel is disposed at a higher position relative to the second wheel in the up-down direction, and
   the first wheel is disposed at a position closer to outside relative to the second wheel in the horizontal direction.

3. The object conveying system according to claim 1, wherein
   a diameter of the first wheel is smaller than a diameter of the second wheel,
   a center of the first wheel is disposed at a position of the same height as a center of the second wheel in the up-down direction, and
   the first wheel is disposed at a position closer to outside relative to the second wheel in the horizontal direction.

4. The object conveying system according to claim 1, wherein
   the horizontal moving mechanism further comprises a third wheel,
   a diameter of the third wheel is the same as a diameter of the second wheel, and a center of the third wheel is disposed at the same horizontal height as a center of the second wheel,
   the third wheel is disposed closer to the side of the object conveying apparatus relative to the second wheel in the horizontal direction,
   in response to the horizontal moving mechanism moving to the mounting table, the second wheel and the third wheel are in contact with the rail.

5. The object conveying system according to claim 4, wherein
   the second wheel and the third wheel are disposed with an elastic apparatus, and the elastic apparatus stretches along the up-down direction,
   the rail comprises a tilt portion, and in response to the horizontal moving mechanism moves to the mounting table, the tilt portion is at least located between the second wheel and the third wheel in the horizontal direction,
   in the elastic apparatus, an elastic coefficient of the elastic apparatus disposed on the second wheel is different from an elastic coefficient of the elastic apparatus disposed on the third wheel.

6. The object conveying system according to claim 4, further comprising:

a plurality of support columns, disposed between the object conveying apparatus and the mounting table and extending along the up-down direction, wherein the rail is disposed with an elastic apparatus, the elastic apparatus stretches along the up-down direction, the elastic apparatus is disposed between the support column close to the side of the object conveying apparatus among the plurality of support columns and the rail, and a hinge is disposed on a connection member between the support column away from the side of the object conveying apparatus among the plurality of support columns and the rail.

* * * * *